United States Patent [19]
Imai

[11] Patent Number: 5,738,165
[45] Date of Patent: Apr. 14, 1998

[54] SUBSTRATE HOLDING APPARATUS

[75] Inventor: Yuji Imai, Ohmiya, Japan

[73] Assignee: Nikon Corporation, Tokyo, Japan

[21] Appl. No.: 462,589

[22] Filed: Jun. 5, 1995

Related U.S. Application Data

[63] Continuation of Ser. No. 175,124, Dec. 29, 1993, abandoned.

[30] Foreign Application Priority Data

May 7, 1993 [JP] Japan .................... 5-106469

[51] Int. Cl.$^6$ .................... F28F 7/00
[52] U.S. Cl. .................... 165/80.2; 165/80.4; 118/728; 156/345; 269/21; 269/903; 279/3
[58] Field of Search .................... 165/80.1, 80.2, 165/80.4, 80.5, 185; 269/21, 903; 118/724, 725, 728; 437/248; 29/25.02; 279/3; 156/345

[56] References Cited

U.S. PATENT DOCUMENTS

| | | | |
|---|---|---|---|
| 3,740,900 | 6/1973 | Youmans | 269/21 X |
| 4,361,749 | 11/1982 | Lord | 165/80.2 X |
| 4,457,359 | 7/1984 | Holden | 165/80.5 |
| 4,721,462 | 1/1988 | Collins, Jr. | 269/21 X |
| 5,033,538 | 7/1991 | Wagner et al. | 165/80.1 |
| 5,281,794 | 1/1994 | Uehara et al. | 279/3 |

FOREIGN PATENT DOCUMENTS

| | | | |
|---|---|---|---|
| 127935 | 7/1985 | Japan | 269/21 |
| 205441 | 8/1989 | Japan | 269/21 |
| 287923 | 11/1989 | Japan | 165/80.4 |
| 319965 | 12/1989 | Japan | 269/21 |
| 95918 | 4/1991 | Japan | 269/21 |
| 256677 | 11/1991 | Japan | 269/21 |
| 152512 | 5/1992 | Japan | 279/3 |
| 2114813 | 8/1983 | United Kingdom | 165/80.2 |

*Primary Examiner*—Leonard R. Leo
*Attorney, Agent, or Firm*—Shapiro and Shapiro

[57] ABSTRACT

A substrate holding apparatus is provided with a plate-shaped substrated holding unit including a first surface having plural protruding portions coming into contact with a plate-shaped substrate. The apparatus is a substantially flat second surface and adapted to support the substrate on the substrate holding unit by suction and comprises a temperature regulating unit which is composed of a material of a high thermal conductivity and positioned as to contact the second surface, a heat discharging the heat from the substrate holding unit, and a heat discharge control unit for controlling the heat discharging property of the heat discharging unit. The substrate holding unit is composed of a material of a high thermal conductivity and a low thermal expansion coefficient and is formed as a thin plate smaller in volume than the temperature regulating unit, and the protruding portions are formed as small projections in order to transfer the localized heat of the substrate to the substrate holding unit through the protruding portions and a space formed by the substrate and the protruding portions.

16 Claims, 2 Drawing Sheets

SUBSTRATE HOLDING APPARATUS

This is a continuation of application Ser. No. 08/175,124 filed Dec. 29, 1993, now abandoned.

BACKGROUND OF THE INVENTION

1. Field of the Invention

The present invention relates to a substrate holding apparatus, and more particularly to a substrate holding apparatus adapted for use in an apparatus for producing integrated circuits, substrates for liquid crystal display panels, thin film magnetic heads or the like.

2. Related Background Art

In the conventional apparatus of this sort, the substrate holding unit is provided therein with a temperature sensor for monitoring the temperature thereof. The substrate holding unit is further provided therein with heating means and cooling means, of which at least either is controlled by a control system, based on the information from said temperature sensor, in such a manner that the substrate holding unit is maintained within a predetermined temperature range.

Such conventional technology explained above has been associated with a drawback that the entire substrate holding unit does not show uniform temperature distribution. This drawback will be explained in the following, for the exemplary case, of step-and-repeat exposure in which each of plural shot areas is exposed by repetition of exposure and stepping operation. In the course of said step-and-repeat operation, the temperature rises in a part of the shot areas, and, because of the displacement of the exposed shot area in time, there is formed a non-linear temperature distribution within the entire area of the substrate holding unit.

Because the temperature distribution within the area of the substrate holding unit varies with time as a result of the step-and-repeat operation, it is not possible to exactly control the temperature of the substrate holding unit by a single temperature sensor and by a set of heating means and cooling means.

Also, in order to reduce the dust deposition onto the rear face of the substrate, the recent substrate holding apparatus is designed with a reduced contact area with the substrate. In such substrate holding apparatus designed with a reduced contact area, the air present between the non-contact portion of the apparatus and the substrate functions as heat-insulating material. For this reason, the heat of the substrate is transmitted only through the contact portions of the substrate holding unit. As a result, the substrate holding unit designed with a reduced contact area, even if provided therein with a temperature regulating member, is incapable of efficient temperature regulation due to the reduced contact area with the substrate.

Still a further drawback of conventional apparatus is that, the substrate holding unit itself becomes bulky because of the presence of the heating and cooling means therein. For this reason, the method of temperature regulation of the substrate by regulating the temperature of the substrate holding unit is incapable of prompt temperature control, thus resulting in a loss in the throughput.

SUMMARY OF THE INVENTION

In consideration of the foregoing, an object of the present invention is to enable exact and efficient control of the substrate temperature.

The above-mentioned object can be attained, according to the present invention, by a substrate holding apparatus comprising:

a plate-shaped substrate holding unit provided with a first surface having plural protruding parts to be maintained in contact with a substrate, and a second surface opposed to said first surface;

a temperature regulating unit provided in contact with said second surface and adapted to absorb the heat accumulated in said substrate holding unit; and a temperature control unit for regulating the temperature of said temperature regulating unit.

According to the present invention, the protruding portions (contact layer) of the substrate holding unit are so limited in height as to realize a very small gap between the substrate and the non-contact areas (other than the protruding portions of the substrate holding unit), so that the heat generated on the substrate can be transmitted not only through the contact layer but also can be efficiently transmitted, by heat convection, to the substrate holding unit.

Also, the substrate holding unit is composed of a material of high thermal conductivity and is designed with a reduced thickness, so that the local heat distribution generated in the substrate can be cancelled on substantially real-time basis to attain a uniform temperature over the entire substrate holding unit. Furthermore, the heat uniformly transmitted to the substrate holding unit is transmitted to and absorbed by the temperature regulating unit on which the substrate holding unit is provided. As the temperature regulating unit is composed of a material of high thermal conductivity, it can efficiently absorb the heat generated in said substrate holding unit.

Furthermore, since said temperature regulating unit is sufficiently larger in volume than said substrate holding unit, the heat is uniformly transmitted to the entire temperature regulating unit, substantially without any temperature increase therein, and is then discharged by temperature-regulating fluid which is precisely temperature controlled.

As explained in the foregoing, the substrate holding apparatus of the present invention, being provided with a thin plate-shaped substrate holding unit having small protruding portions and a temperature regulating unit sufficiently larger in volume than the substrate holding unit, is capable of transmitting the uneven heat distribution, induced by local thermal change on the substrate, through the substrate holding unit and the temperature regulating unit in uniform manner. It is also capable of discharging the heat from the temperature regulating unit substantially without any temperature rise in the substrate holding unit. Furthermore, the separate structure of the substrate holding unit and the temperature regulating unit improves the efficiency of operations such as cleaning. Also, the substrate holding unit and the temperature regulating unit, being mutually fixed by vacuum, are free from the influence of distortion resulting from the difference in thermal expansion coefficients.

DESCRIPTION OF THE PREFERRED EMBODIMENTS

Figure 1:
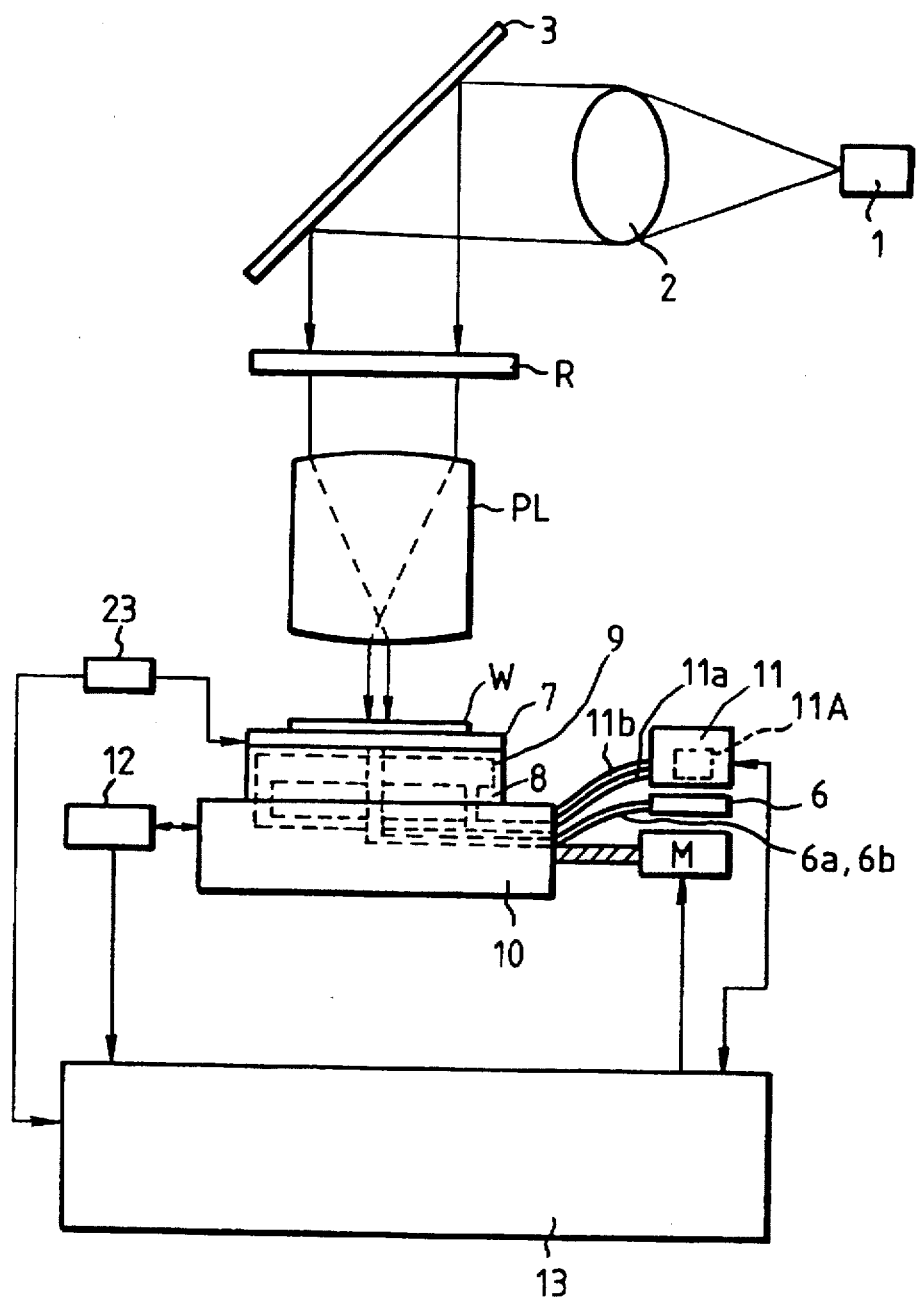
FIG. 1 is a schematic view of a projection exposure apparatus equipped with a substrate holding unit embodying the present invention.

FIG. 1 is a schematic view of a projection exposure apparatus equipped with a substrate holding unit embodying the present invention.

Exposing light, emitted from a light source 1, such as a mercury lamp or an excimer laser, illuminates a mask R with a uniform intensity through a lens system 2 and a mirror 3. The exposing light transmitted by the mask reaches a wafer W through a projection optical system PL, which forms, on said wafer W, an image of the pattern on the mask A temperature regulating unit 8 is placed on a stage 10, and a substrate holding unit 7 holding the wafer W is placed on the temperature regulating unit 8. Said stage 10 is rendered two-dimensionally movable, and the position thereof is measured by an interferometer 12. Based on the position information from said interferometer 12, a control system 13 controls a driving unit M such as a motor. Through such control the stage 10 can be placed at an arbitrary position, and there can be achieved exposures by the step-and-repeat method.

In the following there will be explained a substrate holding control unit 6, which maintains suction holes 20 (cf. FIG. 2) of the substrate holding unit 7 in vacuum state through a vacuum line 6a, whereby the wafer W is supported by suction by the substrate holding unit 7. The substrate holding control unit 6 also causes the substrate holding unit 7 to be supported by suction on the temperature regulating unit 8, through a vacuum line 6b. Said suction holding of the substrate holding unit 7 by the temperature regulating unit 8 through said vacuum line 6b and that of the wafer W by the substrate holding unit 7 through the vacuum line 6a are independently controllable. Consequently it is possible to release the suction holding of the wafer W while the substrate holding unit 7 is supported by suction on the temperature regulating unit 8.

The temperature regulating unit 8 is further provided with a circulating path (heat discharge unit) 9 for circulating temperature-controlled fluid (for example water, inert liquid, air, nitrogen etc.), so as to cover the entire substrate holding unit 7. The fluid from a temperature control unit 11 is supplied to the circulating path 9 through a line 11a, and returns to the temperature control unit 11 through a line 11b. The temperature control unit 11 effects precise temperature control so as maintain the fluid at a substantially constant temperature. Said constant temperature of the fluid is determined, for example, by the stage temperature prior to exposure, and is preferably made to coincide with the temperature of the main body of the projection exposure apparatus. The temperature control unit 11 is further provided with a fluid control unit 11A for maintaining the fluid at a substantially constant speed. The fluid temperature may be determined in advance, but it may also be controlled according to the information from a temperature sensor 23, provided for measuring the temperature of the substrate holding unit 7. The details of such temperature control utilizing the temperature sensor will be explained later.

In the following there will be explained the details of the substrate holding unit 7 and the temperature regulating unit 8, with reference to FIG. 2 which is a cross-sectional view of the temperature regulating unit 8 and the substrate holding unit 7 with the wafer W supported thereon, and FIG. 3 which is a plan view of the substrate holding unit 7.

Figure 2:
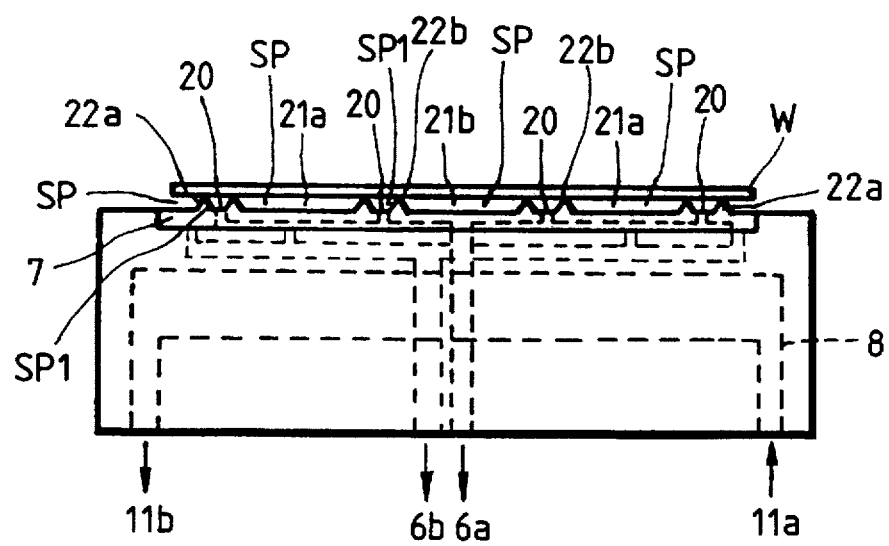
FIG. 2 is a cross-sectional view of a substrate holding unit and a temperature regulating unit embodying the present invention.
Figure 3:
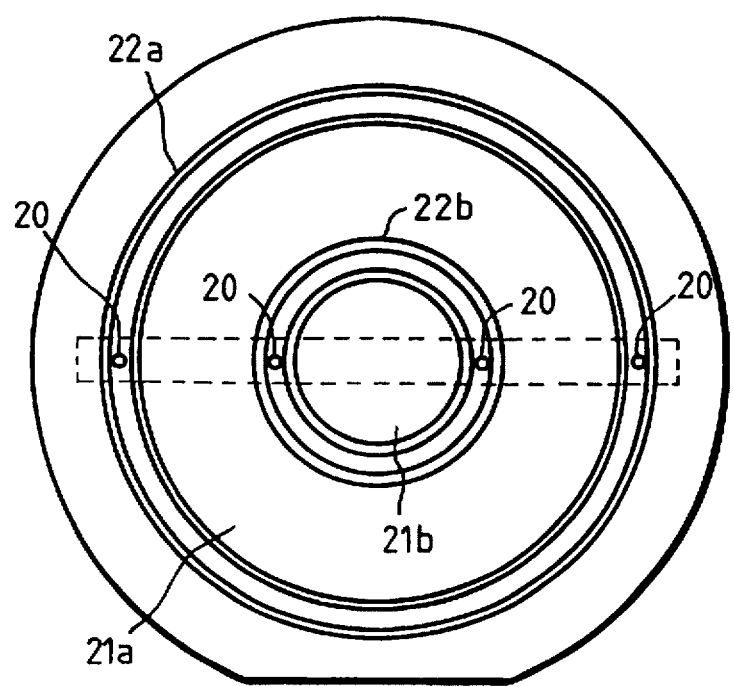
FIG. 3 is a plan view of a substrate holding unit embodying the present invention.

As shown in FIG. 2, the substrate holding unit 7 formed as a thin plate is provided with a plurality of protruding portions 22a, 22b, projecting only by a small amount. On the surface of the substrate holding unit 7, there is provided a vacuum suction hole 20 in each area between the protruding portions (each narrow gap between the protruding portions in FIG. 2), and the wafer W can be fixed by suction to the substrate holding unit 7, as explained before, by sucking air from said vacuum suction holes 20. The surface areas of the substrate holding unit 7 surrounded by plural protruding portions, particularly the wide areas 21a, 21b between the protruding portions, constitute a non-contact portion, which defines a space SP in cooperation with the wafer W. The volume of said space SP is determined by the height of the protruding portions 22 and the area of the non-contact portion 21. If said volume is large, the air in said space SP functions as a heat insulating material. In consideration of the possible contamination by dust, the protruding portions 22 only occupy a small area in comparison with the entire surface area of the substrate holding unit 7, so that the amount of heat that can be transmitted through said protruding portions 22 from the wafer W is quite limited. In the present embodiment, therefore, the height of the protruding portions 22 is made sufficiently small in order to reduce the volume of said space SP, whereby the heat generated in the wafer W is transmitted to the substrate holding unit not only through the protruding portions 22 but also by thermal convection and heat radiation through the air in said space SP. The height of the protruding portions 22 is preferably as small as possible. However, the flatness of the wafer W will be deteriorated if an obstacle of a size not affecting the exposure (a size about tolerance) is present in the space between the wafer W and the non-contact portion 21. For preventing such phenomenon, said height is selected larger than the size of such obstacle around the tolerance. In consideration of this fact, the height of the protruding portion 22 is preferably selected, for example, within a range from 10 to 20 μm. Heat convection is naturally present also in a space SP1 defined by the wafer and the narrow gap between the protruding portions. The substrate holding unit 7 of thin plate shape, having a thickness several times larger than that of the wafer W, is larger in volume and in heat capacity than the wafer W.

In the present embodiment, the exposures are executed by the step-and-repeat method, and a localized heat distribution is generated on the wafer W by the stepwise successive exposures in the shot areas. However, the substrate holding unit 7 is composed of a material of a high thermal conductivity and a low thermal expansion (for example a non-metallic material such as SiC) and is provided with small protruding portions 22. The high thermal conductivity allows efficient transmission of the heat of the wafer W through the protruding portions 22, and allows the heat transmitted through said protruding portions 22 and through the space SP to be spread over the entire substrate holding unit 7.

As the substrate holding unit is composed of a material of a high thermal conductivity and of a low thermal expansion and is constructed as a thin plate with small protruding portions as explained above, the localized heat distribution is dissipated substantially immediately and the entire substrate holding unit 7 reaches a constant temperature. Also, as the low thermal expansion is effective for preventing the positional displacement of the wafer W, the substrate holding unit 7 is preferably composed of a material with a particularly small linear expansion coefficient.

The temperature regulating unit 8 is composed of a material of a high thermal conductivity, for example aluminum. Also, said temperature regulating unit 8 is sufficiently larger, in volume, than the substrate holding unit 7. Consequently, the temperature regulating unit 8 is larger, in heat capacity, than the substrate holding unit 7, so that the heat thereof can be uniformly transmitted to the temperature regulating unit 8 substantially without any temperature rise therein. Also, as the circulating path 9 provided in the temperature regulating unit 8 is so distributed as to cover the entire substrate holding unit 7 (for example, in spiral form substantially same in size to the substrate holding unit 7), the temperature regulating unit 8 can sufficiently discharge the heat from the substrate holding unit 7.

The above-explained two-layered structure of the substrate holding unit and the temperature regulating unit, with a heat capacity of the latter sufficiently larger than that of the former, is effective to isotropically absorb the heat generated on the wafer W and to precisely and efficiently control the temperature of the substrate holding unit. Also, because of said two-layered structure, the substrate holding unit 7 and the temperature regulating unit 8 need not be composed of the same material. Furthermore, said two-layered structure of the substrate holding unit 7 and the temperature regulating unit 8 with mutual fixation of the two by vacuum suction is effective to eliminate the influence of distortion to said substrate holding unit 7, resulting from the difference in thermal expansion of the materials of said units. Furthermore, the fixation of the substrate holding unit 7 and the temperature regulating unit 8 by vacuum suction allows selection of the materials for these units according to the purposes thereof. For example, it is rendered possible to reduce the cost by constituting the substrate holding unit 7 with a more expensive material for obtaining a high thermal conductivity and a low thermal expansion, and the temperature regulating unit 8 with a less expensive material for obtaining a high thermal conductivity and a larger heat capacity.

Furthermore, the mutually separable structure of the substrate holding unit 7 and the temperature regulating unit 8 allows for removal of the substrate holding unit 7 for cleaning thereof, independently from the temperature regulating unit 8. If the substrate holding unit and the temperature regulating unit are integrally constructed as in the prior art, the temperature regulating fluid in the temperature regulating unit has to be taken out at such cleaning operation. On the other hand, the mutually separable structure of the substrate holding unit 7 and the temperature regulating unit 8 as shown in FIG. 1 allows only the substrate holding unit 7 to be taken out and cleaned, without necessity for taking out the fluid, thus improving the efficiency of operation.

In the following there will be explained the mode of temperature regulation in the substrate holding apparatus of the above-explained structure, in an example applied to a projection exposure apparatus.

The projection exposure apparatus equipped with the stage 10, supporting the temperature regulating unit and the substrate holding unit, on which the wafer W is placed, executes the exposure operation by the step-and-repeat method. In this operation, at the exposure of each shot, there is temporarily generated an uneven temperature distribution on the wafer W. The heat accumulated in the wafer W is transmitted to the substrate holding unit 7 through the protruding portions 22. Also, since the height of the protruding portions 22 is small as explained before, the heat accumulated in the wafer W is transmitted by thermal convection to the substrate holding unit 7, through the spaces SP, SP1 between the wafer W and the non-contact portion 21. Since the substrate holding unit 7 is composed of a material of high thermal conductivity and is formed as a thin plate, the temperature distribution on the wafer W becomes substantially uniform within a short time (time until the step motion to the next shot area is completed). The heat accumulated in the substrate holding unit 7 is uniformly transferred to the temperature regulating unit 8, substantially without any temperature rise therein, and is discharged by the fluid circulating within the temperature regulating unit 8. The fluid is controlled at a constant temperature by the temperature regulating unit 8, and the temperature of the fluid is so controlled that the temperature of the substrate holding unit 7 becomes constant. The thermal conductivities of the substrate holding unit 7 and the temperature regulating unit 8, the volume of the spaces SP, SP1, the temperature and speed of the fluid are so determined that the operations of heat absorption by the substrate holding unit 7, heat conduction to the temperature regulating unit 8 and heat discharge therefrom are completed within a time of step motion to the next shot area. In this manner, even during the exposure operations by the step-and-repeat method, the wafer W does not generate localized heat but always maintains a substantially constant temperature, whereby the error in image magnification or in alignment due to heat can be prevented.

If the wafer W generates a heat localization exceeding the tolerance, the heat of the wafer W may not be sufficiently transferred to the substrate holding unit prior to the next exposure, or the heat discharge may not be sufficiently conducted with the fluid of the predetermined temperature prior to the next exposure. In such case there may be provided plural temperature sensors 23 for measuring the temperature of the substrate holding unit 7, in order to monitor the states of heat conduction and heat discharge, and the exposure of the next shot area may be executed after the completion of heat discharge. Otherwise there may be provided a temperature sensor 23, for monitoring the temperature state, thereby controlling the temperature of the fluid. As an example of such monitoring of the temperature state, if the substrate holding unit 7 reaches a predetermined temperature prior to the lapse of a predetermined time, there is judged formation of a large localization of heat, and the temperature of the fluid is lowered to enhance the heat discharge.

As will be understood from the foregoing, it is rendered possible, even in the exposure operation of the step-and-repeat method, to prevent non-linear expansion of the substrate resulting from heat accumulation by the exposures, and to prevent errors in the image magnification and in the alignment, resulting from the thermal expansion of the substrate.

What is claimed is:

1. An exposure apparatus that forms patterns of a mask in plural shot areas on a substrate by an operating cycle involving repeated exposure and displacement of said substrate, and that includes a substrate holding apparatus comprising:

a) a substrate holding unit having plural protruding portions to support said substrate thereon for exposure and displacement;

b) a temperature regulating unit that absorbs heat accumulated in said substrate holding unit by contact with said substrate holding unit;

c) a temperature control unit that controls temperature of said temperature regulating unit by removing heat from said temperature regulating unit during said operating cycle; and d) a fixation unit which releasably holds said temperature regulating unit contact with said substrate holding unit;

e) wherein said substrate holding unit is formed as a thin plate effective to ensure that localized heat formed on said substrate upon exposure is dissipated to achieve a substantially uniform thermal distribution.

2. An exposure apparatus according to claim 1, wherein the heat capacity of said temperature regulating unit is larger than that of said substrate holding unit.

3. An exposure apparatus according to claim 1 wherein said substrate holding unit and said temperature regulating unit are made of different materials.

4. An exposure apparatus according to claim 1, wherein said temperature control unit operates such that said substrate holding unit has substantially the same temperature at a start of each exposure.

5. An exposure apparatus according to claim 1, wherein said temperature control unit operates such that said substrate holding unit is maintained at a substantially constant temperature throughout said operating cycle.

6. An exposure apparatus that forms patterns of a mask in plural shot areas on a substrate by an operating cycle involving repeated exposure and displacement of said substrate, and that includes a substrate holding apparatus comprising:
   a) a substrate holding unit having plural protruding portions to support said substrate thereon for exposure and displacement;
   b) a temperature regulating unit that absorbs heat accumulated in said substrate holding unit by contact with said substrate holding unit;
   c) a temperature control unit that controls temperature of said temperature regulating unit by removing heat from said temperature regulating unit during said operating cycle; and
   d) a vacuum suction apparatus for holding said temperature regulating unit in contact with said substrate holding unit by vacuum suction.

7. An exposure apparatus according to claim 6, wherein said substrate holding unit is formed as a thin plate effective to ensure that localized heat formed on said substrate upon exposure is dissipated to achieve a substantially uniform thermal distribution.

8. An exposure apparatus according to claim 7, wherein said substrate holding unit is composed of a material having a small linear expansion coefficient.

9. An exposure apparatus according to claim 7, wherein said substrate holding unit is composed of a non-metallic material.

10. An exposure apparatus according to claim 6, wherein said substrate holding unit and said temperature regulating unit are made of different materials.

11. An exposure apparatus according to claim 6, wherein said temperature control unit operates such that said substrate holding unit has substantially the same temperature at a start of each exposure.

12. An exposure apparatus according to claim 6, wherein said temperature control unit operates such that said substrate holding unit is maintained at a substantially constant temperature throughout said operating cycle.

13. An exposure apparatus that forms patterns of a mask in plural shot areas on a substrate by an operating cycle involving repeated exposure and displacement of said substrate, and that includes a substrate holding apparatus comprising:
   a) plate-shaped substrate holder having one side provided with plural protruding portions to support said substrate thereon for exposure and displacement, and an opposite side;
   b) a temperature regulator having a surface adapted to contact said opposite side of substrate holder to absorb heat from said substrate holder, said temperature regulator having an internal path for passing a heat conducting fluid therethrough and having means for applying vacuum suction to said opposite side of said substrate holder to hold said surface of said temperature regulator in contact with said opposite side of said substrate holder; and
   c) a temperature controller that controls temperature of said fluid during said operating cycle such that said fluid removes heat from said temperature regulator.

14. Aan exposure apparatus according to claim 13, wherein said substrate holder and said temperature regulator are made of different materials.

15. An exposure apparatus according to claim 13, wherein said temperature controller operates such that said substrate holder has substantially the same temperature at a start of each exposure.

16. An exposure apparatus according to claim 13, wherein said temperature controller operates such that said substrate holder is maintained at a substantially constant temperature during throughout said operating cycle.

* * * * *